US 6,610,605 B2

(12) United States Patent
Rowlette et al.

(10) Patent No.: US 6,610,605 B2
(45) Date of Patent: Aug. 26, 2003

(54) METHOD AND APPARATUS FOR FABRICATING ENCAPSULATED MICRO-CHANNELS IN A SUBSTRATE

(75) Inventors: Jeremy A. Rowlette, Palo Alto, CA (US); Paul Winer, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/895,128

(22) Filed: Jun. 28, 2001

(65) Prior Publication Data
US 2003/0003753 A1 Jan. 2, 2003

(51) Int. Cl.$^7$ ............................................. H01L 21/311
(52) U.S. Cl. ..................................................... 438/700
(58) Field of Search ................................ 438/700, 667, 438/28; 257/414, 415

(56) References Cited

U.S. PATENT DOCUMENTS

| | | |
|---|---|---|
| 5,514,832 A | 5/1996 | Dusablon, Sr. et al. |
| 5,928,207 A | 7/1999 | Pisano et al. |
| 6,008,126 A * | 12/1999 | Leedy .......................... 438/667 |
| 6,216,343 B1 * | 4/2001 | Leland et al. .......... 29/890.032 |
| 6,224,950 B1 * | 5/2001 | Hirata ......................... 427/535 |
| 6,262,464 B1 * | 7/2001 | Chan et al. .................. 257/414 |
| 6,399,406 B2 * | 6/2002 | Chan et al. .................... 438/28 |
| 6,477,901 B1 | 11/2002 | Tadigadapa et al. |

* cited by examiner

*Primary Examiner*—Son T. Dinh
*Assistant Examiner*—Pho M. Luu
(74) *Attorney, Agent, or Firm*—Blakely, Sokoloff, Taylor & Zafman LLP

(57) ABSTRACT

A method for fabricating encapsulated micro-channels in a substrate is described. The method includes the formation of a thin film layer over an area of a substrate. Following the formation of the thin layer, a periodic array of access holes are formed within the thin film layer along dimensions of one or more desired micro-channels. Following formation of the access holes, the one or more micro-channels are formed, via the access holes, within an underlying layer of the substrate. Finally, the one or more micro-channels are encapsulated, thereby closing the one or more access holes along the dimensions of the desired micro-channels. Accordingly, the method is suitable in one context for rapid prototyping of micro-electromechanical systems in the areas of, for example, RF micro-systems, fluidic micro-systems and bio-fluidic applications. In addition, the method enables the rapid prototyping of integrated circuits.

18 Claims, 13 Drawing Sheets

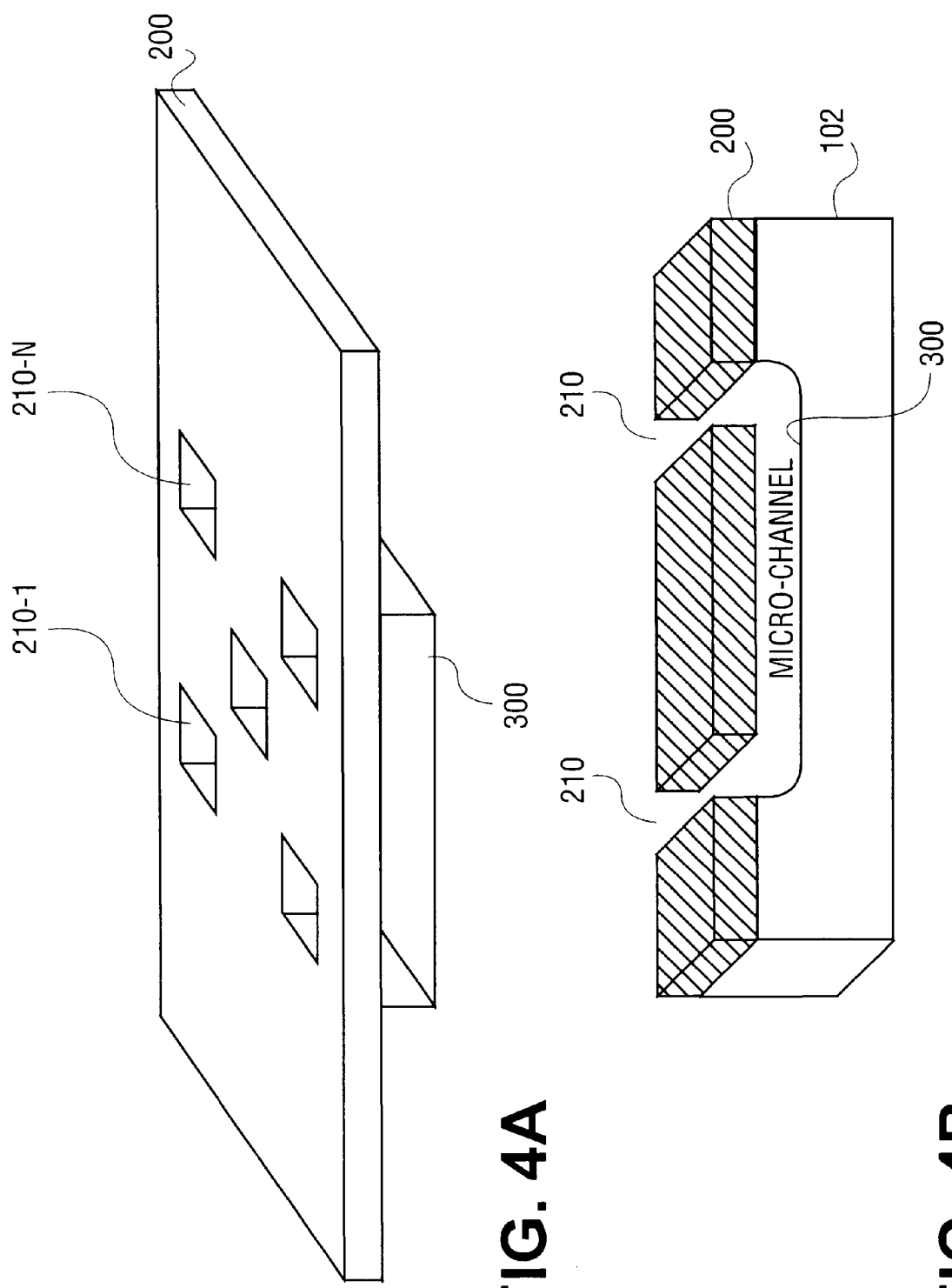

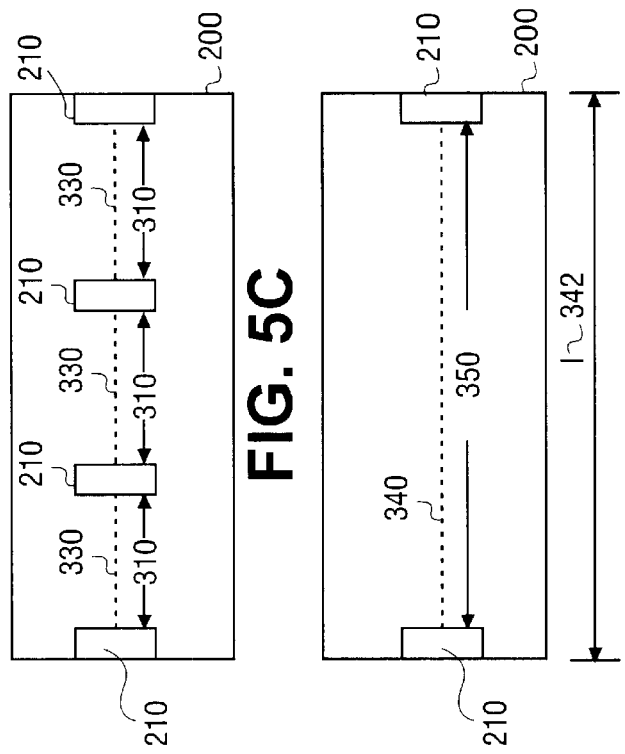
FIG. 5C
FIG. 5D
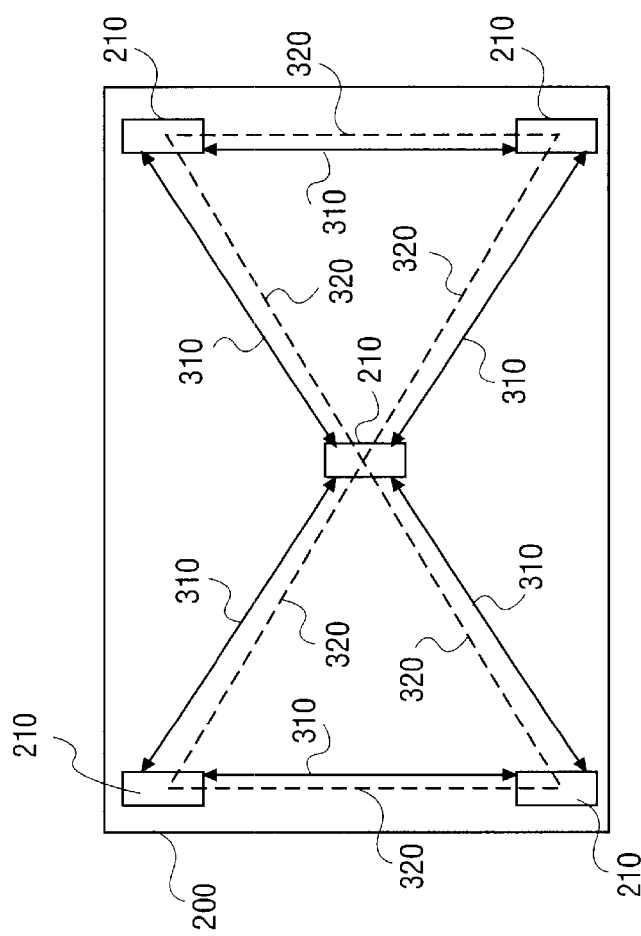
FIG. 5B

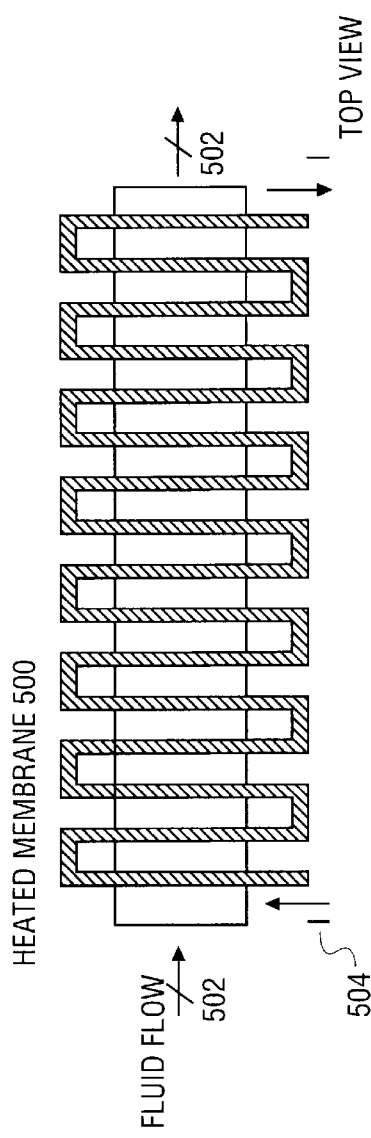
FIG. 10A TOP VIEW
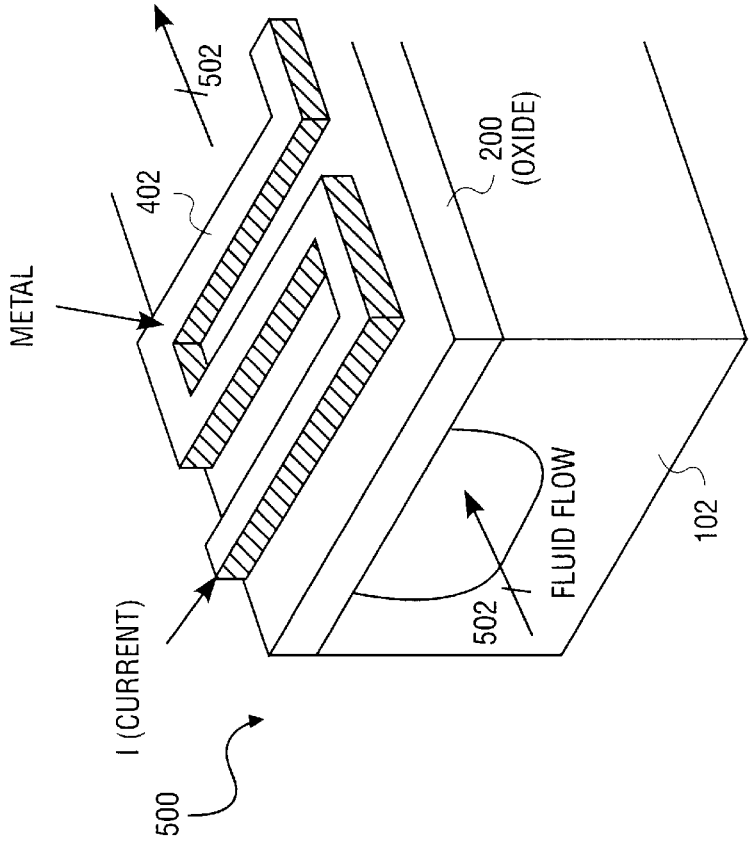
FIG. 10B SIDE VIEW

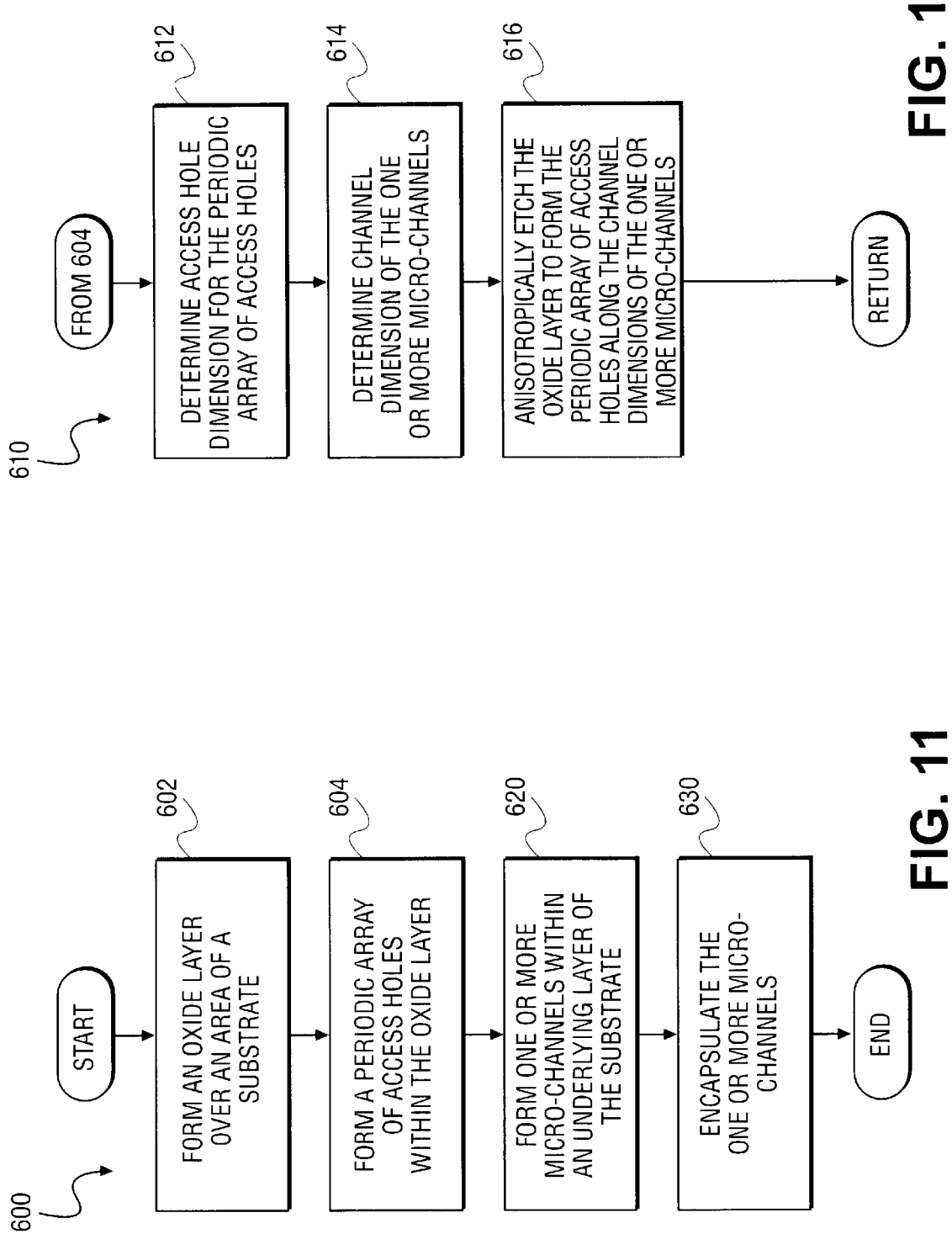

METHOD AND APPARATUS FOR FABRICATING ENCAPSULATED MICRO-CHANNELS IN A SUBSTRATE

FIELD OF THE INVENTION

The present invention relates generally to a rapid prototyping of micro-electromechanical structures. In particular, the present invention relates to an apparatus and method for fabricating encapsulated micro-channels in a substrate.

BACKGROUND OF THE INVENTION

Micro-electromechanical systems (MEMS) provide a technology which enables the miniaturization of electrical and mechanical structures. MEMS is a field created primarily in the silicon area, where the mechanical properties of silicon (or other materials such as aluminum, gold, etc.) are used to create miniature moving components. In fact, the MEMS area has been applied to the miniaturization and integration of frequency selected devices to bring such devices to the chip level. In addition, MEMS has also been applied to biological systems in order to create fluidic micro-systems in the area of micro-fluidics.

Micro-machining is a technology with specific application to MEMS systems and is broadly defined as the selective removal of silicon substrates to result in suspended structures on membranes. Both micro-machining and MEMS can also be applied to GaAs, quartz and ceramic substrates. Specifically, micro-machining can aid in the building of integrated circuits. For example, using direct-write ion beam milling, integrated circuits can be quickly and easily debugged, as well as verified. The verification and debugging occurs by milling of the circuits to cut and paste conductors, resistors, capacitors or the like, or change the conductance, inductance or resistance values of these devices.

Moreover, direct-write micro-machining provides significant advantages, as opposed to batch processing of circuits using traditional photo-lithographical techniques, which require the creation of masks in order to implement devices within integrated circuits. For example, in the area of micro-fluidics, conventional design of the various channels within the micro-fluidic devices requires the design of masks to create the structures on a fabricated wafer. As described above, this can be very time consuming. For example, in fluidic micro-systems, the characterization of channels generally requires wafer fabrication and the creation of masks in order to create and test such devices. Accordingly, the rapid prototyping of radio frequency (RF) micro-systems, as well as fluidic micro-systems, is not feasible using traditional techniques, such as photolithographic masking techniques, especially in bio-fluidic applications.

Therefore, there remains a need to overcome one or more of the limitations in the above-described, existing art.

BRIEF DESCRIPTION OF THE DRAWINGS

The features, aspects, and advantages of the present invention will become more fully apparent from the following Detailed Description and appended claims when taken in conjunction with accompanying drawings in which:

FIGS. 4A and 4B depict a block diagrams illustrating the formation of a micro-channel within the substrate and below the oxide layer.

FIGS. 5A–5D depict block diagrams illustrating various configurations of access holes in accordance with an exemplary embodiment of the present invention.

FIGS. 10A and 10B depict a micro-fluidic device formed in accordance with the teachings of the present invention.

FIG. 11 depicts a block diagram illustrating a method for the fabrication of an encapsulated micro-channel within a substrate.

FIG. 12 depicts a block diagram illustrating an additional method for forming a periodic array of access windows within an oxide layer in accordance with a further embodiment of the present invention.

DETAILED DESCRIPTION OF THE INVENTION

A method and apparatus for fabricating encapsulated micro-channels in a substrate are described. The method described includes the formation of a thin film layer over an area of a substrate. Following the formation of the thin film layer, a periodic array of access holes or windows are formed within the thin film layer along dimensions of one or more desired micro-channels. Following formation of the access windows, the one or more micro-channels are formed within an underlying layer of the substrate. Finally, the one or more micro-channels are encapsulated, thereby closing the one or more access windows along the dimensions of the desired micro-channels. Accordingly, the method is suitable in one context for rapid prototyping of micro-electromechanical systems in the areas of, for example, RF micro-systems, fluidic micro-systems and bio-fluidic applications. In addition, the method enables the rapid prototyping of integrated circuits.

An apparatus is also described. In one embodiment, the apparatus includes a thin film layer formed on an area of a substrate. Once formed, a periodic array of access holes are formed along dimensions of one or more desired micro-channels. Next, the micro-channels are etched from the substrate via the access holes. Finally, the access holes are closed by depositing a partial thin film layer over a surface of the thin film layer. In the context of micro-mechanical or micro-electromechanical structures, the apparatus describes a further miniaturization effort, for example, of fluidic micro-systems as well as RF micro-systems and devices.

In the following description, for the purposes of explanation, numerous specific details are set forth in order to provide a thorough understanding of the present invention. It will be apparent, however, to one skilled in the art that the present invention may be practiced without some of these specific details. For example, various thin film layers, access hole configurations, and micro-channels may be modified according to the teachings of the present invention. In addition, the following description provides examples, and the accompanying drawings show various examples for the purposes of illustration. However, these examples should not be construed in a limiting sense as they are merely intended to provide examples of the present invention rather than to provide an exhaustive list of all possible implementations of the present invention. In other instances, well-known structures and devices are shown in block diagram form in order to avoid obscuring the details of the present invention.

System Architecture

Figure 1:
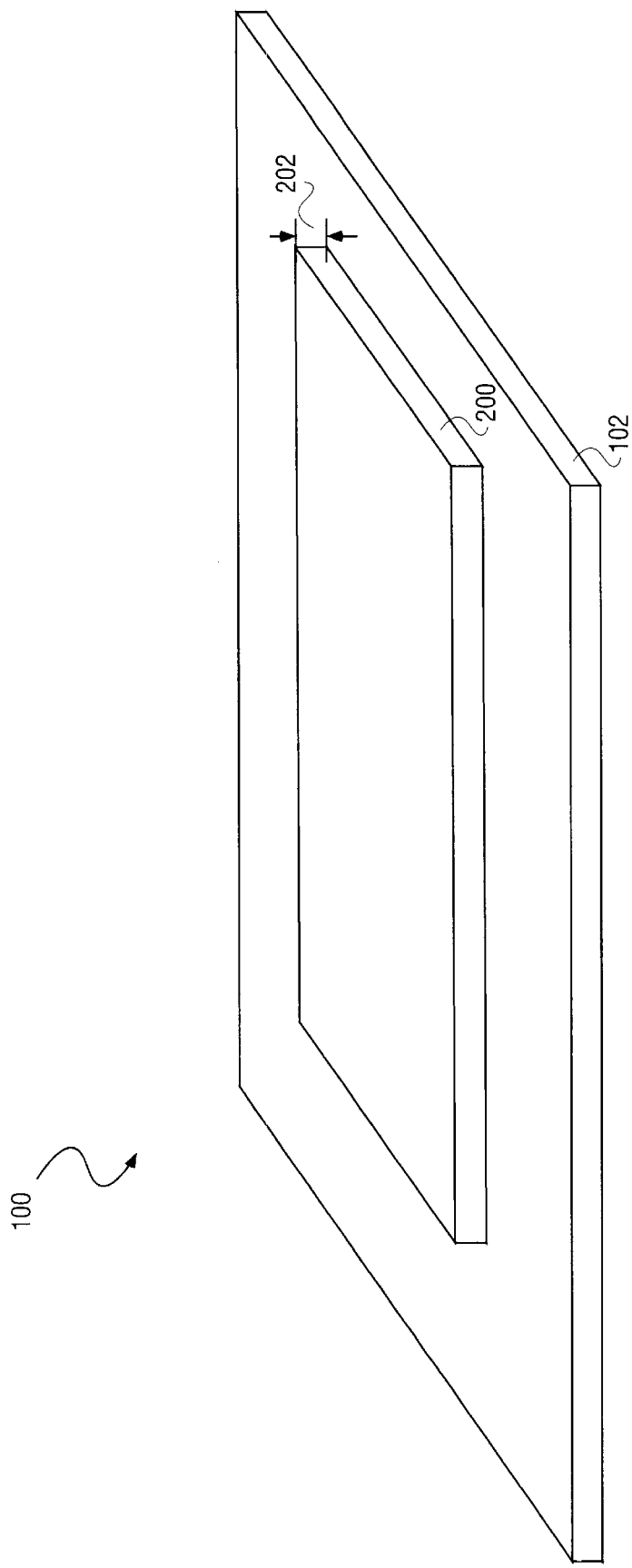
FIG. 1 depicts a block diagram illustrating an oxide layer formed over an area of a substrate in accordance with an embodiment of the present invention.

Referring now to FIG. 1, a substrate 102 is depicted. The substrate 102 is generally a silicon wafer, for example, a silicon wafer pacified with, for example, $SiO_2$. A thin film or oxide layer 200 may be deposited or grown over the substrate 100. The thin film layer 200, which is in one embodiment silicon nitride, is provided with an optimized thickness 202 for minimized photon absorption during laser chemical etching and maximized mechanical stability. In one embodiment, a thickness ($\tau$) 202 of the thin film layer 200 is between 0.1 micrometers and 4.0 micrometers, but is most likely between 0.75 micrometers to 1.20 micrometers.

Figure 2A:
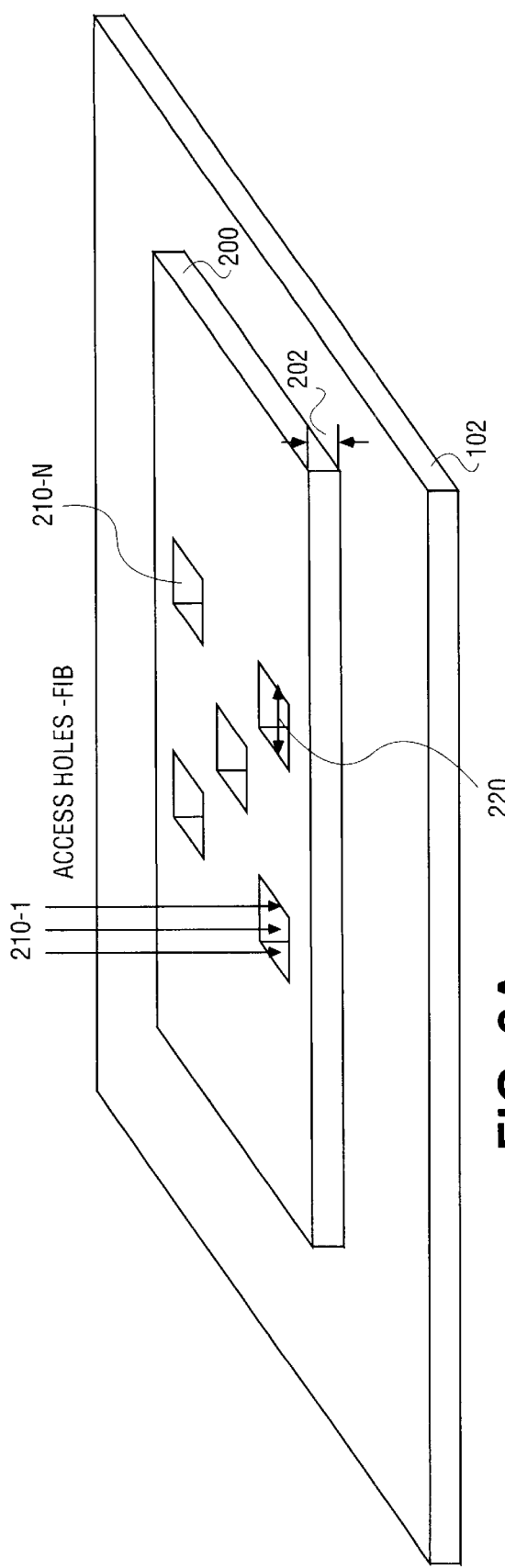
FIGS. 2A and 2B depict block diagrams illustrating the oxide layer including a periodic array of access holes in accordance with a further embodiment of the present invention.
Figure 2B:
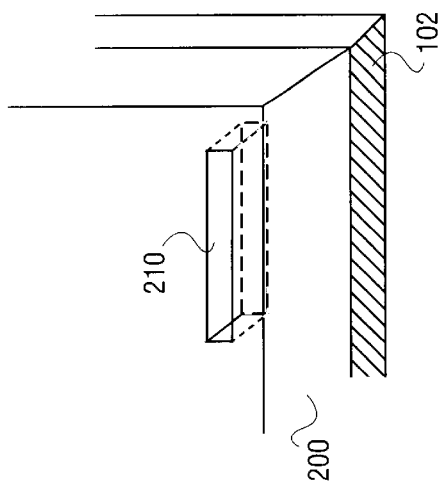

Referring now to FIGS. 2A and 2B, a block diagram of the substrate 102, including the oxide layer 200, is depicted, which illustrates one or more periodic access holes or windows 210 (210-1, . . . , 210-N) formed within the oxide layer 200. The periodic access holes or windows 210 are formed using direct-write, chemically assisted focused ion beam etching. As described in further detail below, the periodic access windows 210 enable the formation of one or more micro-channels within the substrate 102.

Accordingly, depicted in FIG. 2B, the access windows 210 are etched within the oxide layer 200 and not within the substrate. As such, the periodic access windows 210 are formed along channel dimensions of one or more desired micro-channels in order to assist in the formation of micro-channels within the substrate 102. Consequently, the access windows 210 enable fabrication of fully encapsulated micro-channels of arbitrary lengths and widths on the surface of a silicon substrate (and potentially other substrates) using existing direct-write etching tools.

Figure 3:
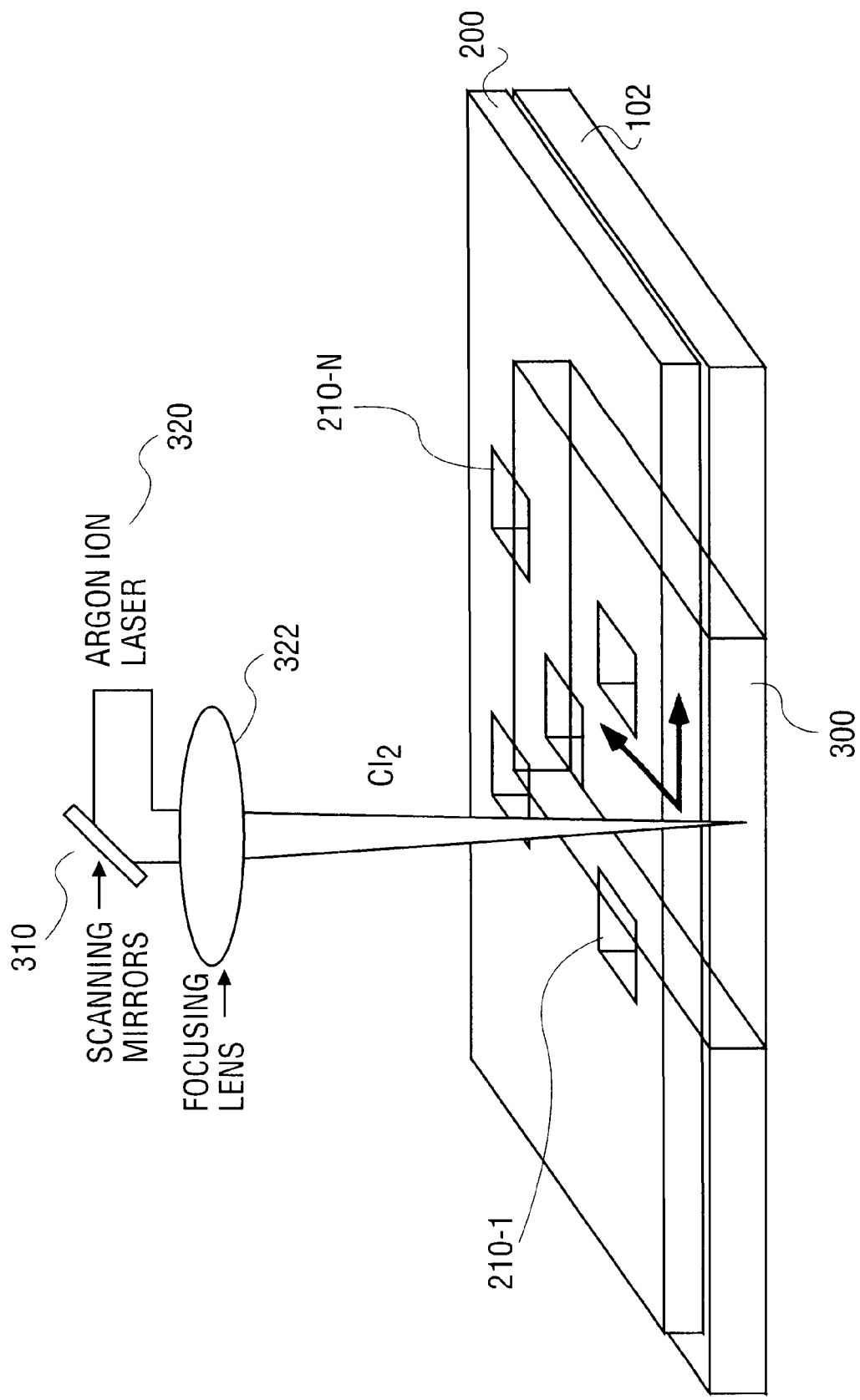
FIG. 3 depicts a block diagram illustrating etching of the substrate via the periodic array of access windows in accordance with a further embodiment of the present invention.

Referring now to FIG. 3, formation of the one or more micro-channels 300 within the substrate 102 is depicted. For example, a scan beam of a laser chemical etcher is performed in a region where a micro-channel is desired in order to provide optimal power density/spot size. In one embodiment, an argon ion laser 320 utilizes a scanning mirror 310 to etch the substrate with a molecular chlorine ($Cl_2$ gas ambient) in order to etch the underlying silicon. As described above, etching occurs along the desired channel dimensions defined by the periodic array of access windows 210 to form the one or more micro channels.

The completion of the one or micro-channels 300 within the substrate 102 is illustrated with reference to FIGS. 4A and 4B. As such, FIG. 4A illustrates a free-standing oxide membrane or micro-channel 300, which exists along the remaining access windows 210. As described above, the creation of such micro-channels is vital to RF micro-systems, fluidic micro-systems and bio-fluidic applications. However, in order to enclose the micro-fluidic channels (as depicted in FIG. 4B) to provide the functionalities desired by the fluidic micro-systems, the one or more access windows are closed in order to encapsulate the micro-channels. Enclosure of the micro-channels is depicted with reference to FIGS. 5A–5D.

Figure 5A:
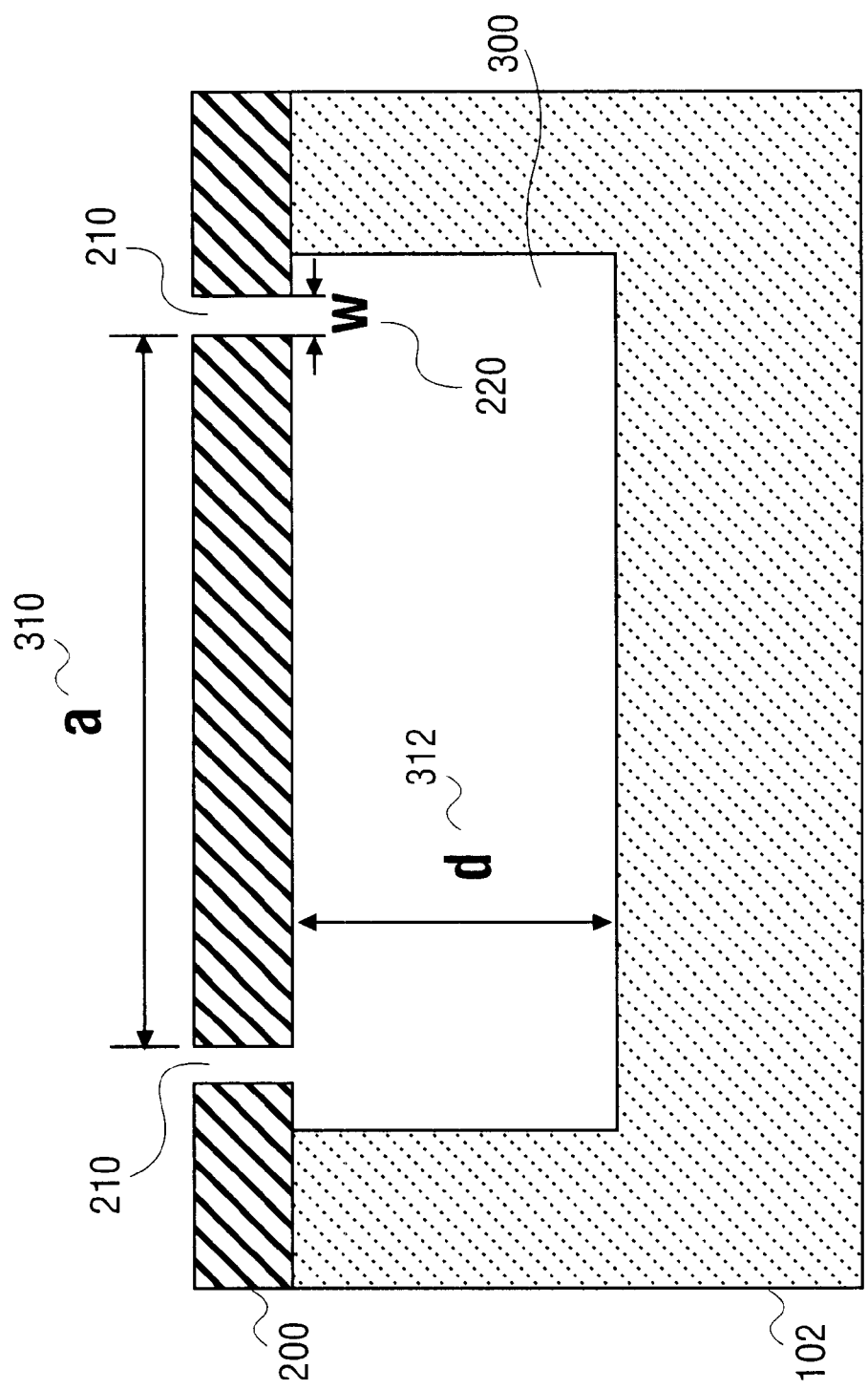

Referring now to FIGS. 5A–5D, these referenced figures depict various possible configurations of access holes within the thin film layer 200. FIG. 5A depicts a micro-channel within the substrate 102. As depicted, the micro-channel 300 has a maximum desired depth (D) 312 while a separation distance (A) 310 between the edges of neighboring access holes 210 is also illustrated. An optimal value for the separation distance A 310 between neighboring access holes 210 depends upon the geometric dimensions of the desired channel 300, as well as the gaseous pressure in the laser chemical etch chamber. In one embodiment, when the flow of reaction by-products out of the micro-channel 300 and/or the reactant species is limited by molecular diffusion, then the access holes 210 should be placed periodically along the dimensions of the desired micro-channel 310, as depicted in FIGS. 5B and 5C.

In the embodiment described, reaction by-products include for example, $SiCl_4$, whereas the reactant species is, for example, $Cl_2$. In addition, limitations caused by molecular diffusion will result when either the rate of out-diffusion of by-products or in-diffusion of reactant is slow or comparable to the laser beam scan rate. As such, in the embodiment described, configuration of the access holes 210, as depicted in FIGS. 5B and 5C, enable increasing of the uniformity of reactant and by-product distribution along the channel 320/330. Accordingly, this will lead to more uniform etching throughout the channel 320/330.

However, if neither the flow of reaction by-products out of the micro-channel 320/330 nor the reactant species are limited by molecular diffusion, then the access holes 210 should be placed at edges of the micro-channel 340, as depicted in FIG. 5D. Accordingly, as illustrated in FIG. 5D, the reactant by-products and the reactant species are not limited by molecular diffusion since both the rate of out-diffusion of by-products and the in-diffusion of reactant is fast compared to the laser scan beam rate. Accordingly, configuration of access holes 210, as depicted in FIG. 5D, prevents over-etching of the micro-channel 340. Moreover, the beam should be scanned, at minimum, over exposed regions in order to prevent over-etching in these regions.

As such, etching of the silicon layer 102 will proceed almost isotropically wherever the laser beam is focused and there is a clear, unobstructed path for the reactant species. In other words, etching will be uniformly performed in all crystal orientations of the silicon substrate 102. Consequently, if the beam is continuously scanned over an access hole 210, the region of silicon below the access hole 210 will etch more than the remainder of the channel, which is referred to herein as an "over-etch". Namely, if a regular period array of access holes 210 is determined to be the optimal solution for process conditions, then the spacing of the access holes 210 from edge to edge or from center to center should be minimized. In one embodiment, spacing of the access holes 210 to center to center is performed if the width 220 of the access hole 210 is small compared to the spacing A 310 between the various access holes, as is generally the case.

Figure 6:
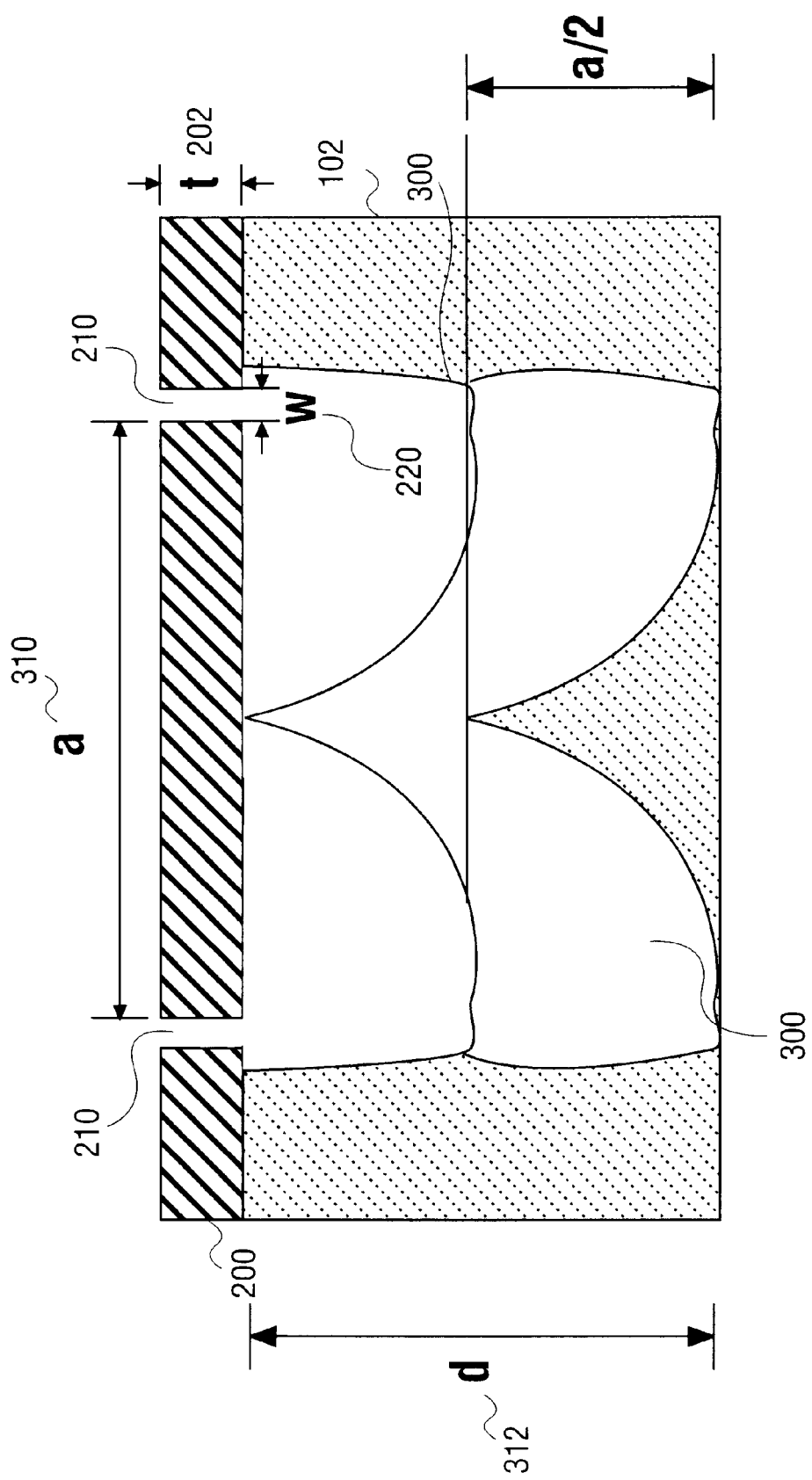
FIG. 6 depicts a block diagram illustrating optimal spacing of access holes in accordance with an exemplary embodiment of the present invention.

Referring now to FIG. 6, FIG. 6 depicts a block diagram illustrating formation of the micro-channel 300 to implement optimal spacing of the access holes 210. Referring now to FIG. 6, minimization of spacing A (310) between the access holes is generally accomplished by finding the floor unit uniformity of the following equation:

$$\text{Uniformity}=1-(A/2D). \quad (1)$$

As illustrated by uniformity is optimal at the value of one. This optimal value results from the fact that (1) either because A 310 is very small or (2) D 312 is very large. Consequently, as a general guideline, access hole separation distance A (310) will be in the range of 100 nanometers to 1 millimeter, and will depend explicitly on the length and width of the desired micro-channel 300.

Figure 7:
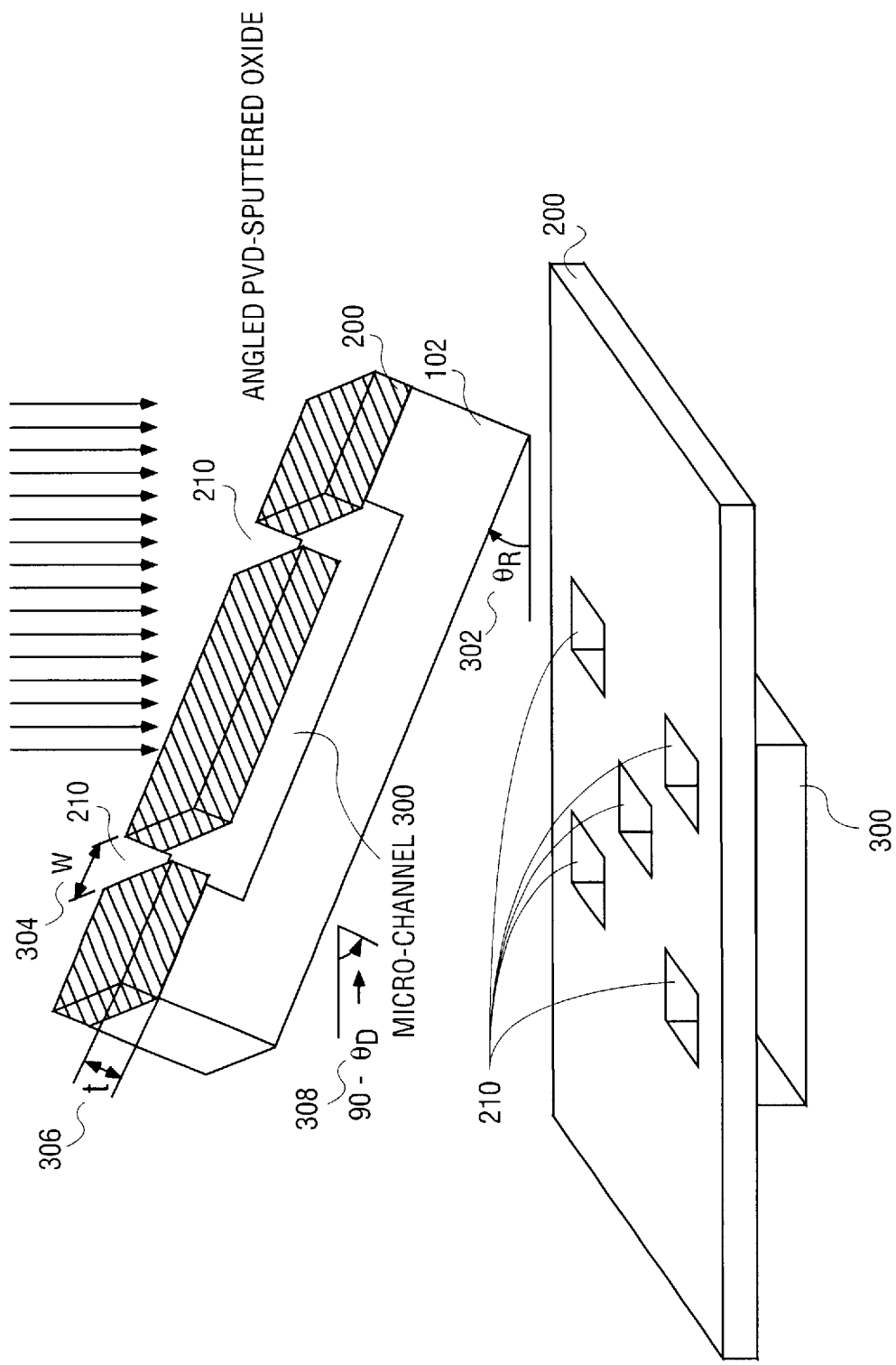
FIG. 7 depicts a block diagram illustrating deposition of a partial oxide layer over an angled surface of the substrate in order to close the one or more access holes in accordance with a further embodiment of the present invention.
Figure 8:
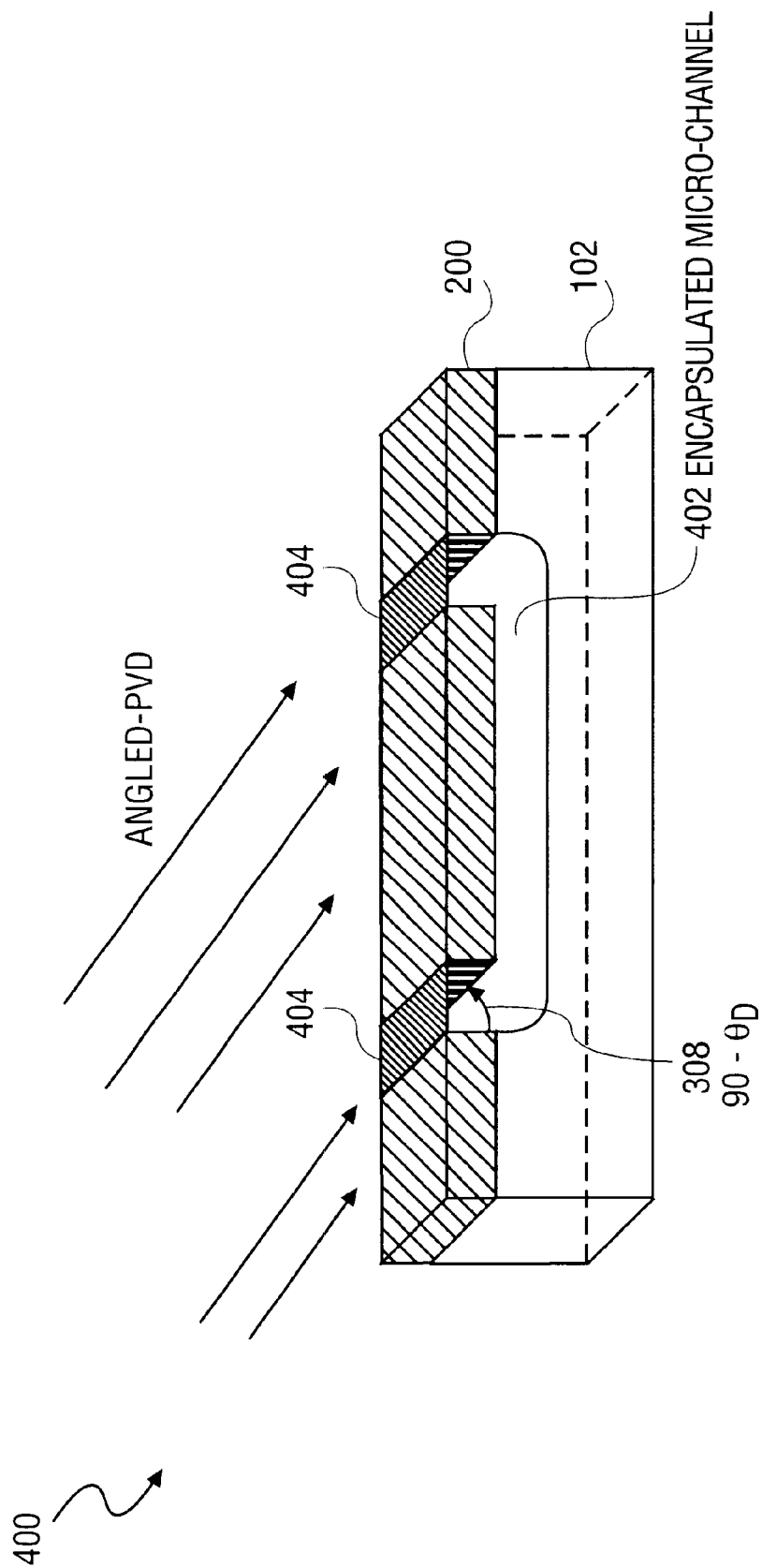
FIG. 8 depicts a block diagram illustrating encapsulation of a micro-channel formed within the substrate in accordance with an exemplary embodiment of the present invention.

FIG. 7 illustrates the introduction of a partial oxide layer (not shown), which is used to close the one or more access holes 210 in order to recreate the thin film layer 200. In one embodiment, as depicted in FIG. 5, the one or more access holes 210 are closed by tilting the substrate 102 to a predetermined angle ($\theta_R$) 302. In the depicted embodiment, the substrate 102 is tilted to an angle of, for example, 45° wherein a deposition of, for example a non-conformal layer of oxide is provided via, for example, a physical vapor deposition source. In one embodiment, this is accomplished by the deposition of sputtered oxide to form a partial oxide layer 404 that encloses the micro-channels 300 in order to form encapsulated micro-channel 402 (FIG. 8). Alternatively, silicon nitride may be deposited over the thin film layer 200.

Figure 9:
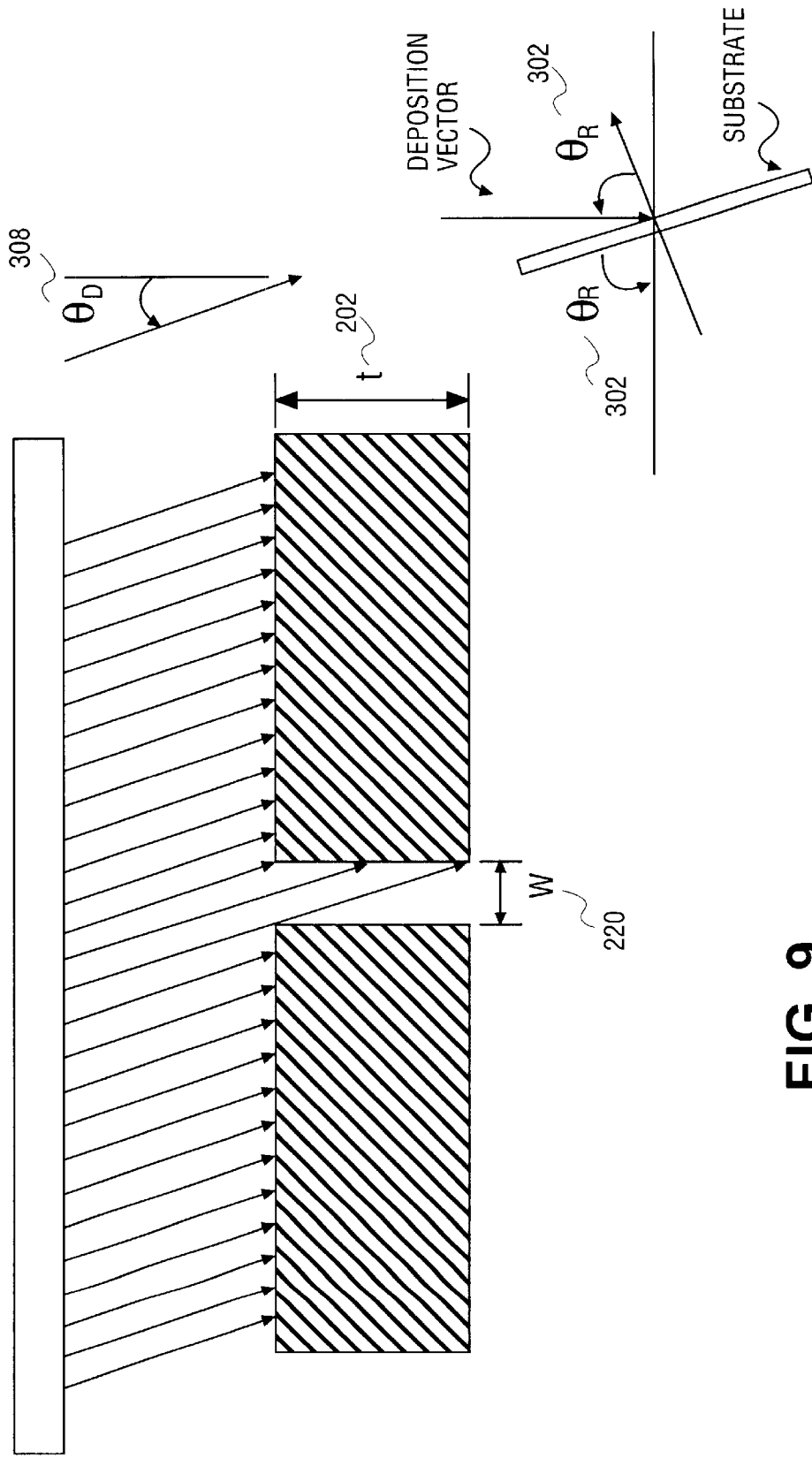
FIG. 9 depicts a block diagram illustrating calculation of a deposition angle in accordance with an exemplary embodiment of the present invention.

Referring now to FIG. 9, FIG. 9 depicts a block diagram illustrating calculation of the deposition angle in order to close the access holes 210 and encapsulate the one or more micro-channels for a line of sight deposition with a sticking co-efficient of one. Generally, the deposition angle is defined within the range of θ min, which is less than $\theta_R$, which is less than 90°

$$\theta_{min}<\theta_R<90° \quad (2)$$

In the embodiment described, θ min equals tangent$^{-1}$ (W/T), which equals tangent$^{-1}$ (1/A$_{ar}$):

$$\theta_{min}=\tan^{-1}(1/A_{ar}). \quad (3)$$

In the embodiment described, the variable "A$_{ar}$" is defined as the aspect ratio of the depth (T) 202 of the oxide layer to the width (W) 220 of the access hole 210. As described above, the thickness of the film 200 is generally in the range of 50 nanometers to 5 micrometers, whereas the width 220 of the various micro-channels is controlled by the focused ion beam etch and the desired tilt angle ($\theta_R$) 302 of the final deposition. Accordingly, the angle of rotation $\theta_R$ 302 may be used to calculate the deposition angle ($\theta_D$ 308) as the angle measured from the vector normal to the substrate surface, depending on whether the substrate or deposition is rotated, such that:

$$|\theta_R|=|\theta_D|. \quad (4)$$

Accordingly, the method described uses a combination of focused ion beam/laser chemical etching and physical vapor deposition to fabricate encapsulated micro-channels on a silicon substrate. The teachings of the present invention enable applications in micro-electromechanical systems and specific application in bio-MEMS technology, which require micro-fluidic channeling, as well as fluidic micro-systems and RF micro-systems. Systems performed using the teachings of the present invention are hinged upon an angled physical vapor deposition process, i.e., sputtered oxide followed by an optional conformal oxide/diaelectric layer for planarization and additional reliability of the initial oxide layer.

For example, FIGS. 10A and 10B depict a heated membrane formed in accordance with the teaching of the present invention. Referring now to FIG. 10B, a plurality of micro-channels 402 (402-1, . . . , 402-N) are formed in a substrate 102 and enclosed by an oxide layer 200. Accordingly, current 504 flows through the micro-channels 402 in order to heat fluid 502 which flows through a chamber 506. Procedural methods for implementing the teachings of the present invention are now described.

Operation

Referring now to FIG. 11, FIG. 11 depicts a block diagram illustrating a method 600 for fabricating one or more encapsulated micro-channels 402 within a substrate 102, for example, as depicted with reference to FIGS. 1–9. At process block 602, a thin film or oxide layer 200 is formed over an area of a substrate 102. In one embodiment, the oxide layer 200 may be formed over the substrate 102 using a low temperature deposition. In one embodiment, the oxide layer 200 may be grown over an area of the substrate 102.

In an alternative embodiment, the thin film layer 200 is, for example, a low temperature silicon nitride. In addition, the oxide layer 200 should have an optimized thickness 202 for minimized photon absorption during laser chemical etching and maximized mechanical stability, as depicted with reference to FIG. 1. Following formation of the oxide layer 200, process block 604 is performed. At process block 604, a periodic array of access holes or windows 210 is formed within the oxide layer 200, as depicted with reference to FIGS. 2A and 2B and 5A–6.

As described herein, the terms "access windows" and "access holes" are used interchangeably depending on the dimensions of the access holes/windows. In one embodiment, the periodic access holes, or windows 210, are formed within the thin film layer 200 using chemically assisted focused ion beam etching. As illustrated with reference to FIG. 2B, the access windows, or holes, 210 do not protrude within or into the substrate 102, but are formed solely within the oxide layer 200. Following formation of the access holes 210, process block 620 is performed.

At process block 620, one or more micro-channels are formed within an underlying area of the substrate 102, as depicted with reference to FIGS. 3–4B. As depicted with reference to FIG. 3, in one embodiment an argon ion laser 320 utilizes a scanning mirror 310 in order to provide a scanned beam of the laser chemical etch in a region where a micro-channel is desired. By utilizing the periodic array of access windows 210, the scanned beam is provided with desired optimal power density/spot size, utilizing a molecular chlorine (CL$_2$) gas ambient in order to etch the underlying silicon 102 and form the one or more micro-channels.

Formation of a completed micro-channel 300 is depicted with reference to FIG. 4, wherein FIG. 4B illustrates the micro-channel 300 formed within the substrate 102 and below the oxide layer 200 via access windows 210. However, in order for a micro-channel to be utilized within a MEMS based system, the micro-channel 300 requires enclosure. Consequently, at process block 630, the one or more micro-channels 300 are encapsulated, as depicted with reference to FIGS. 7 and 9. As illustrated with reference to FIGS. 7 and 9, the substrate is rotated to a pre-determined angle 302. Once rotated, an oxide is deposited along the angled surface of the substrate in order to close or reform the one or more access holes 210. As such, the closing of the one or more access holes in order to encapsulate the micro-channel is depicted with reference to FIG. 9.

Referring now to FIG. 12, an additional method 610 is illustrated for forming a periodic array of access windows 200 within the oxide layer 200, for example, as depicted in FIGS. 2A, 2B and 5A–6. At process block 612, access window dimensions are determined for the periodic array of access windows 210. In one embodiment, an aspect ratio of the access windows are generally larger than or equal to one, such that the width 202 of the oxide layer 200 equals a length 220 of the access window 210, as depicted with reference to FIG. 2A. As such, the oxide layer 200 width 202 is generally equal to the access window length 220 resulting in an aspect ratio of one.

However, those skilled in the art will appreciate that various modifications of the access hole/window configurations, such as the hole/window length 220 and the oxide layer width 202, may be modified without departing from the scope of the present invention, as depicted in FIGS. 5A–6. Once dimensions for the periodic array of access windows 210 are determined, process block 614 is performed. At process block 614, channel dimensions of the one or more micro-channels are determined. Accordingly, the periodic array of access windows 210 are formed along the channel dimensions of the one or more desired micro-channels. Once the channel dimensions are determined, process block 616 is performed.

At process block 616, the oxide layer 200 is anisotropically etched to form the periodic array of access holes 210 along the channel dimensions of the one or more desired micro-channels. In one embodiment, direct-write focused ion-beam milling is used to anisotropically etch the thin film layer 200 in order to form access holes 210. Accordingly, by forming the periodic array of access windows 210 along the channel dimensions of the one or more micro-channels, etching the underlying area of the substrate 102 is facilitated by using a laser chemical etcher for rapid prototyping of one or more micro-channel along the desired dimensions of the one or more micro-channels. Consequently, one or more micro-channels 300 are therefore readily formed within the underlying area of the substrate 102, as depicted with reference to FIGS. 3–4B.

Figure 13:
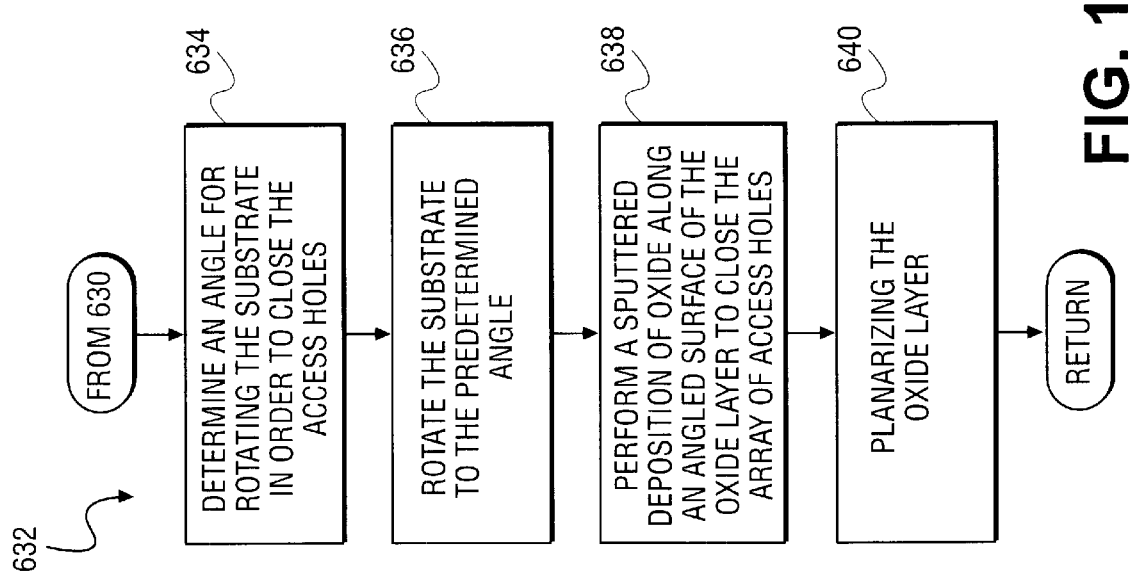
FIG. 13 depicts a block diagram illustrating an additional method for encapsulating one or more micro-channels in accordance with an exemplary embodiment of the present invention.

Referring now to FIG. 13, FIG. 13 depicts a block diagram illustrating an additional method 632 for encapsulating the one or more micro-channels 300 following formation of the one or more micro-channels 210, as depicted with reference to FIGS. 6, 7 and 9. At process block 634, an angle for rotation of the substrate $\theta_R$ 302 is determined in order to close the access holes 210. In one embodiment, the pre-determined angle $\theta_R$ 302 is, for example 45°. However, those skilled in the art will appreciate that various rotation angles may be utilized within the scope and teachings of the present invention based on the desired closure of the access holes 210.

At process block 636, the substrate 102, including the oxide layer 200, is rotated to the pre-determined angle 302 calculated at process block 634. Following rotation of the substrate to the pre-determined angle 302, process block 638 is performed. At process block 638, a sputter deposition of oxide is performed along an angled surface of the oxide layer 200 to close the array of access windows 210 using a partial oxide layer 404, as depicted with reference to FIG. 8. In one embodiment, the sputter deposition of the partial oxide layer 404 is performed using a physical vapor deposition source. In an alternative embodiment, a sputter deposition of silicon nitride is performed along an angled surface of the nitride layer 200 to close the array of access holes 210 using a partial silicon nitride layer 404, as depicted with reference to FIG. 8

Once the periodic array of access holes are closed in order to encapsulate the one or more micro-channels 402, process block 640 is performed. At process block 640, the oxide layer 200 is planarized. In one embodiment, a surface of the oxide layer 200 can be coated with a conformal layer of dielectric, which can planarize the surface. The dielectric is, for example, one of an oxide nitride or some silicon-based polymer. In an alternative embodiment, a chemical-mechanical polishing step can planarize the surface of the oxide layer 200.

Alternative Embodiments

Several aspects of one implementation of a method for fabricating encapsulated micro-channels in a substrate using a periodic array of access holes or windows have been described. However, various implementations of the method utilizing various configurations of access hole dimensions for fabricating encapsulated micro-channels in a substrate for rapid prototyping of MEMS device and bio-MEMS application provide numerous features including, complementing, supplementing, and/or replacing the features described above. Features can be implemented as part of an RF, micro-fluidic, micro-system or as integrated circuits in different implementations. In addition, the foregoing description, for purposes of explanation, used specific nomenclature to provide a thorough understanding of the invention. However, it will be apparent to one skilled in the art that the specific details are not required in order to practice the invention.

In addition, although an embodiment described herein is directed to a MEMS device utilizing fabricated, encapsulated micro-channels, it will be appreciated by those skilled in the art that the teaching of the present invention can be applied to other systems. In fact, systems for MEMS device utilizing fabricated encapsulated micro-channels are within the teachings of the present invention, without departing from the scope and spirit of the present invention. The embodiments described above were chosen and described in order to best explain the principles of the invention and its practical applications. These embodiment were chosen to thereby enable others skilled in the art to best utilize the invention and various embodiments with various modifications as are suited to the particular use contemplated.

It is to be understood that even though numerous characteristics and advantages of various embodiments of the present invention have been set forth in the foregoing description, together with details of the structure and function of various embodiments of the invention, this disclosure is illustrative only. In some cases, certain subassemblies are only described in detail with one such embodiment. Nevertheless, it is recognized and intended that such subassemblies may be used in other embodiments of the invention. Changes may be made in detail, especially matters of structure and management of parts within the principles of the present invention to the full extent indicated by the broad general meaning of the terms in which the appended claims are expressed.

The present invention provides many advantages over known techniques. The present invention includes the ability for fabrication of fully encapsulated micro-channels of arbitrary lengths and widths on the surface of a silicon substrate (and potentially other substrates) using existing direct-write etching tools. The use of direct-write etching tools allows for the possibility of developing rapid prototyping for micro-electro-mechanical systems (MEMS) with specific application to micro-fluidic systems and RF micro-systems. In addition, the process taught by the present invention is low temperature and compatible with current low temperature packing technology, making the possibility for prototyping thermal management systems/networks on the back side of current integrated circuit products.

As such, when combined with the circuit edit technologies, MEMS structures can be rapidly constructed without the cost and time required for conventional pointer processing. Likewise, the present invention may be implemented for debug and prepare previously constructed Microsystems analogous to microsurgery used during first silicon debug. The technology of encapsulated micro-channels could be used with other techniques to affect or pair as an improved performance of existing micro-system designs without the need to create new masks and process wafers from scratch.

In addition, potential engineering change orders (ECO) to the micro-system's design could be verified in advance to significantly improve the success rate of design changes. Furthermore, the low temperature process is compatible with microprocessor packaging technology. Consequently, micro-fluidic channels and their structures can also be prototyped on the back side of a silicon substrate of a production product in close proximity to active transistor layers for the purpose of heat management (directing heat away from active device areas).

Having disclosed exemplary embodiments, modifications and variations may be made to the disclosed embodiments while remaining within the scope of the invention as defined by the following claims.

What is claimed is:

1. A method comprising:
    over an area of a substrate, forming a thin film layer;
    following forming the thin film layer, forming a periodic array of access holes within the thin film layer;
    forming, via the access holes, one or more micro-channels within an underlying area of the substrate; and
    following forming of the micro-channels, encapsulating the one or more micro-channels.

2. The method of claim 1, following the encapsulation of the micro-channels, further comprising:
    coating a surface of the thin layer with a dielectric layer in order to planarize the surface of the thin film layer.

3. The method of claim 2, wherein the substrate comprises silicon, the thin film layer comprises one of silicon oxide and a low temperature silicon nitride, the dielectric layer comprises one of oxide, nitride, and silicon polymer, and forming the oxide layer comprises growing.

4. The method of claim 1, following the encapsulating of the micro-channels, further comprising:
    chemically, mechanically polishing of the thin film layer to planarize the thin film layer.

5. The method of claim 1, wherein forming the access holes comprises:
    determining channel dimensions of the one or more micro-channels; and
    anisotropically etching the thin film layer using direct-write focused ion beam milling to form the periodic array of access holes along the channel dimension of the one or more micro-channels.

6. The method of claim 1, wherein forming the micro-channels comprises:
    etching an underlying area of the substrate, using a laser chemical etcher to rasterize a focused laser beam along desired channel dimensions of the one or more micro-channels, such that the one or more micro-channels are formed within the underlying area of the substrate.

7. The method of claim 1, wherein encapsulating the micro-channels comprises:
    following forming of the micro-channels, depositing a silicon oxide over the thin film layer using a physical vapor deposition source to encapsulate the one or more micro-channels.

8. The method of claim 7, wherein encapsulating the micro-channels further comprises:
    rotating the substrate to a predetermined angle; and
    performing a sputtered deposition of silicon oxide along an angled surface of the thin film layer to close the periodic array of access holes, such that the one or more micro-channels are encapsulated by the oxide layer.

9. A method comprising:
    over an area of a surface of a substrate, depositing an oxide layer;
    following depositing the oxide layer, anisotropically etching the oxide layer to form a periodic array of access holes within the oxide layer, the period array of access holes formed along channel dimensions of one or more desired micro-channels;
    etching, via the access holes, an underlying area of the substrate to create one or more micro-channels within the underlying area of the substrate according to the channel dimensions defined by the periodic array of access holes; and
    following forming of the micro-channels, depositing an oxide over the oxide layer to encapsulate the one or more micro-channels.

10. The method of claim 9, following the encapsulation of the micro-channels, further comprising:
    coating a surface of the oxide layer with a dielectric layer in order to planarize the surface of the oxide layer.

11. The method of claim 10, wherein the substrate comprises silicon, the oxide layer comprises a low temperature silicon nitride, the dielectric layer comprises one of oxide, nitride, and silicon polymer, and forming the oxide layer comprises growing.

12. The method of claim 9, following the encapsulating the micro-channels, further comprising:
    chemically, mechanically polishing of the oxide layer to planarize the oxide layer.

13. The method of claim 9, wherein forming the access windows comprises:
    determining channel dimensions of the one or more micro-channels; and
    anisotropically etching the oxide layer using direct-write focused ion beam milling to form the periodic array of access holes along the channel dimension of the one or more micro-channels.

14. The method of claim 9, wherein etching an underlying area comprises:
    using a laser chemical etcher to rasterize a focused laser beam along the channel dimensions of the one or more micro-channels, such that the one or more micro-channels are formed within the underlying area of the substrate.

15. The method of claim 9, wherein encapsulating the micro-channels comprises:

using a physical vapor deposition source to deposit the oxide over the oxide layer in order to encapsulate the one or more micro-channels.

16. The method of claim 15, wherein encapsulating the micro-channels further comprises:

rotating the substrate to a predetermined angle; and performing a sputtered deposition of oxide along an angled surface of the oxide layer to close the periodic array of access holes, such that the one or more micro-channels are encapsulated by the oxide layer.

17. A method comprising:

over an area of a substrate, forming a thin film layer;

following forming the thin film layer, forming a periodic array of access holes within the thin film layer;

forming, via the access holes, one or more micro-channels within an underlying area of the substrate;

rotating the substrate to a predetermined angle; and performing a sputtered deposition of silicon oxide along an angled surface of the thin film layer to close the periodic array of access holes, such that the one or more micro-channels are encapsulated by the thin layer.

18. A method comprising:

over an area of a surface of a substrate, depositing an oxide layer;

following depositing the oxide layer, anisotropically etching the oxide layer to form a periodic array of access holes within the oxide layer, the period array of access holes formed along channel dimensions of one or more desired micro-channels;

etching, via the access holes, an underlying area of the substrate to create one or more micro-channels within the underlying area of the substrate according to the channel dimensions defined by the periodic array of access holes; and rotating the substrate to a predetermined angle; and performing a sputtered deposition of oxide along an angled surface of the oxide layer to close the periodic array of access holes, such that the one or more micro-channels are encapsulated by the oxide layer.

* * * * *